United States Patent
Kawasumi

(10) Patent No.: US 8,687,448 B2
(45) Date of Patent: Apr. 1, 2014

(54) SEMICONDUCTOR MEMORY DEVICE AND SENSE AMPLIFIER

(75) Inventor: Atsushi Kawasumi, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 177 days.

(21) Appl. No.: 13/425,315

(22) Filed: Mar. 20, 2012

(65) Prior Publication Data
US 2013/0064028 A1    Mar. 14, 2013

(30) Foreign Application Priority Data

Sep. 12, 2011 (JP) ................ P2011-197808

(51) Int. Cl.
*G11C 7/00* (2006.01)
(52) U.S. Cl.
USPC ............ 365/203; 365/205; 365/206; 365/207
(58) Field of Classification Search
USPC .................................. 365/203, 205, 206, 207
See application file for complete search history.

(56) References Cited

U.S. PATENT DOCUMENTS

| | | | |
|---|---|---|---|
| 5,568,438 A | 10/1996 | Penchuck | |
| 6,535,443 B1 * | 3/2003 | OuYang et al. | 365/207 |
| 6,859,386 B2 * | 2/2005 | Izutsu | 365/154 |
| 7,477,560 B2 | 1/2009 | Kawasumi | |
| 8,018,757 B2 | 9/2011 | Kawasumi | |

FOREIGN PATENT DOCUMENTS

| | | |
|---|---|---|
| JP | 07302497 A2 | 11/1995 |
| JP | 3961024 B2 | 5/2007 |

\* cited by examiner

*Primary Examiner* — Son Dinh
(74) *Attorney, Agent, or Firm* — Knobbe Martens Olson & Bear LLP

(57) ABSTRACT

A semiconductor memory device comprises a memory cell; a first bit line and a second bit line connected to the memory cell; and a sense amplifier operative to amplify the voltage between the first and second bit lines. The sense amplifier includes a first and a second drive transistor configuring a transistor pair for differential amplification, and a first and a second capacitor connected between the sources of the first and second drive transistors and a source control terminal, respectively. The sense amplifier precharges the first and second drive transistors on the drain side prior to sensing, thereby holding the threshold information on the first and second drive transistors in the first and second capacitors, and compensates for the source voltages on the first and second drive transistors by the threshold information held in the first and second capacitors at the time of sensing.

20 Claims, 3 Drawing Sheets

US 8,687,448 B2

SEMICONDUCTOR MEMORY DEVICE AND SENSE AMPLIFIER

CROSS-REFERENCE TO RELATED APPLICATIONS

This application is based upon and claims the benefit of priority from the prior Japanese Patent Application No. 2011-197808, filed on Sep. 12, 2011, the entire contents of which are incorporated herein by reference.

FIELD

The embodiment described herein relates to a semiconductor memory device and sense amplifier.

BACKGROUND

Description of the Related Art

In recent years, as mobile terminals have become widespread, for example, requirements have increasingly grown for improving the degree of integration of semiconductor memory devices and lowering power consumption therein. In accordance therewith, how to reduce has become important on the offset caused by variations in threshold voltages of transistors contained in memory cells and sense amplifiers. Particularly, in an SRAM (static random access memory), the charge/discharge power by the cell current in an extremely large capacity bit line forms a large proportion of power consumption. Accordingly, it is required to intensify the sensitivity of the sense amp so that it can start sensing at a small bit line voltage difference. It is thus desired that the offset in the sense amplifier in the SRAM is as small as possible.

As methods of reducing offsets in such sense amplifiers, those conventionally known include a method of holding trimming data at every sense amplifier, and a method of reducing offsets (hereinafter referred to as "zeroing") by superimposing an offset voltage on a bit line as part of operation of the sense amplifier.

The trimming-based method, however, requires holding trimming data at every sense amplifier and accordingly causes a large area overhead as a problem. Zeroing does not require holding trimming data at every sense amplifier though it is a method of superimposing an offset voltage on a bit line. Therefore, an increase arises in the charge/discharge current in the bit line to oppose the lowering of power consumption.

DETAILED DESCRIPTION

A semiconductor memory device according to the embodiment comprises a memory cell; a first bit line and a second bit line connected to the memory cell; and a sense amplifier operative to amplify the voltage between the first and second bit lines. The sense amplifier includes a first and a second drive transistor configuring a transistor pair for differential amplification, and a first and a second capacitor connected between the sources of the first and second drive transistors and a source control terminal, respectively. The sense amplifier precharges the first and second drive transistors on the drain side prior to sensing, thereby holding the threshold information on the first and second drive transistors in the first and second capacitors, and compensates for the source voltages on the first and second drive transistors by the threshold information held in the first and second capacitors at the time of sensing.

[First Embodiment]

Figure 1:
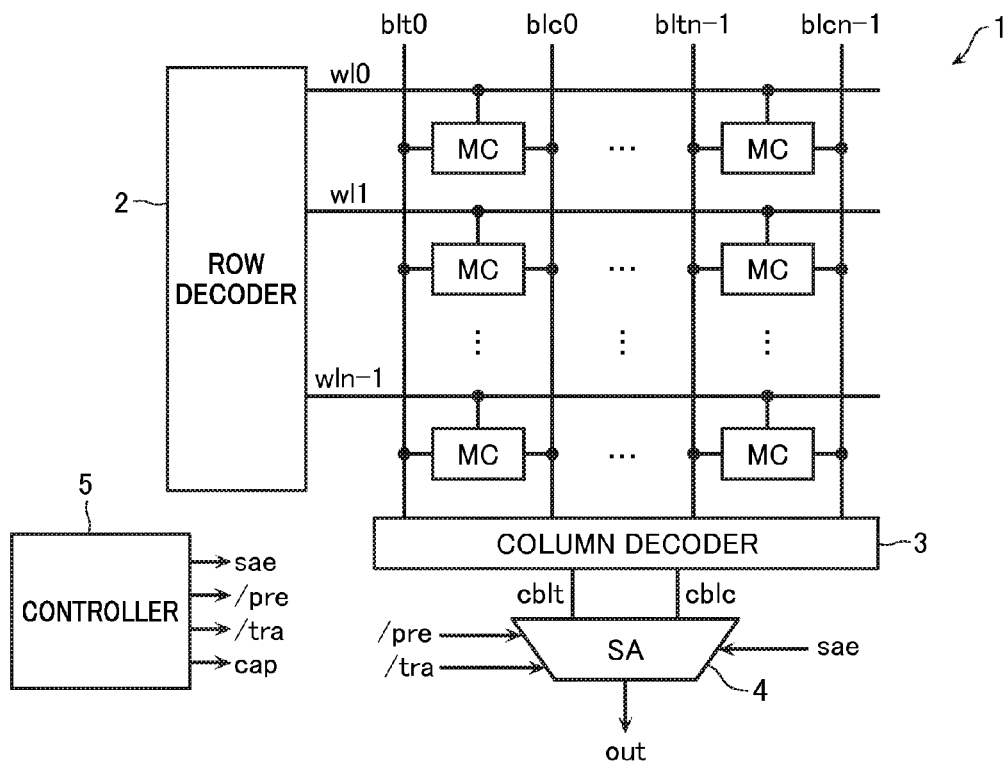
FIG. 1 is a block diagram showing the configuration of a semiconductor memory device according to a first embodiment.

FIG. 1 is a block diagram showing the configuration of a semiconductor memory device according to a first embodiment. This semiconductor memory device is configured as an SRAM, which comprises a memory cell array 1 including memory cells MC arranged in a matrix.

The memory cells MC are connected to plural pairs of bit lines, blt and blc, which are used to transfer pieces of data mutually inverted. The bit lines blt, blc may be formed in a hierarchy. The memory cells MC are also connected to plural word lines wl that cross the bit lines blt, blc at right angles. The word lines wl are connected to a row decoder 2, which selects the word line wl based on a row address and controls writing data in the memory cell MC and reading data from the memory cell MC. The bit lines blt, blc are connected to a column decoder 3, which selects the bit lines blt, blc based on a column address and controls writing data in the memory cell MC and reading data from the memory cell MC. The column decoder 3 is connected to a sense amplifier 4 via common bit lines, cblt and cblc, which are connected to the selected bit lines blt, blc. The sense amplifier 4 differentially amplifies data on the common bit lines cblt, cblc, and provides data out to external. A controller 5 generates various control signals sae, /pre, /tra and cap required for operations of the sense amplifier 4 and supplies them to the sense amplifier 4.

Figure 2:
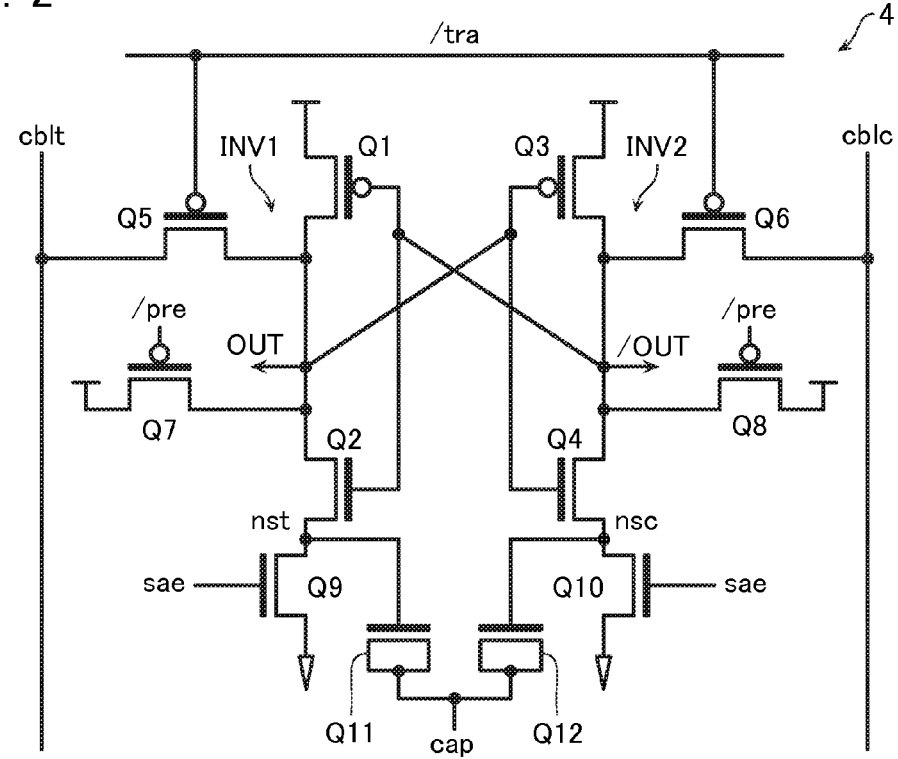
FIG. 2 is a circuit diagram showing the configuration of a sense amplifier in the same semiconductor memory device.

FIG. 2 is a circuit diagram showing the configuration of the sense amplifier 4. The sense amplifier 4 includes a first inverter INV1 composed of a PMOS transistor Q1 and an NMOS transistor Q2 connected in a complementary pair, and a second inverter INV2 composed of a PMOS transistor Q3 and an NMOS transistor Q4 connected in a complementary pair. The input and output terminals of the first inverter INV1 are connected to the output and input terminals of the second inverter INV2, respectively. A data transfer PMOS transistor Q5 is connected between the output terminal (OUT) of the first inverter INV1 and the bit line cblt. A data transfer PMOS transistor Q6 is connected between the output terminal (/OUT) of the second inverter INV2 and the bit line cblc. A precharge PMOS transistor Q7 is connected between the output terminal of the first inverter INV1 and a supply terminal (Vdd: first reference voltage terminal). A precharge PMOS transistor Q8 is connected between the output terminal of the second inverter INV2 and the supply terminal (Vdd).

An NMOS transistor Q9 is connected between the source of the drive NMOS transistor Q2 and a ground terminal (GND: second reference voltage terminal). An NMOS transistor Q10 is connected between the source of the drive NMOS transistor Q4 and the ground terminal (GND). A first capacitor Q11 using the gate capacity of an NMOS transistor is connected between the source of the drive NMOS transistor Q2 and a source control signal cap terminal. A second capacitor Q12 using the gate capacity of an NMOS transistor is connected between the source of the drive NMOS transistor Q4 and the source control signal cap terminal.

Next, an operation of the sense amplifier 4 thus configured is described. Prior to the operation of the sense amplifier 4 according to the present embodiment, an operation of a general sense amplifier is described as a comparison example.

Figure 5:
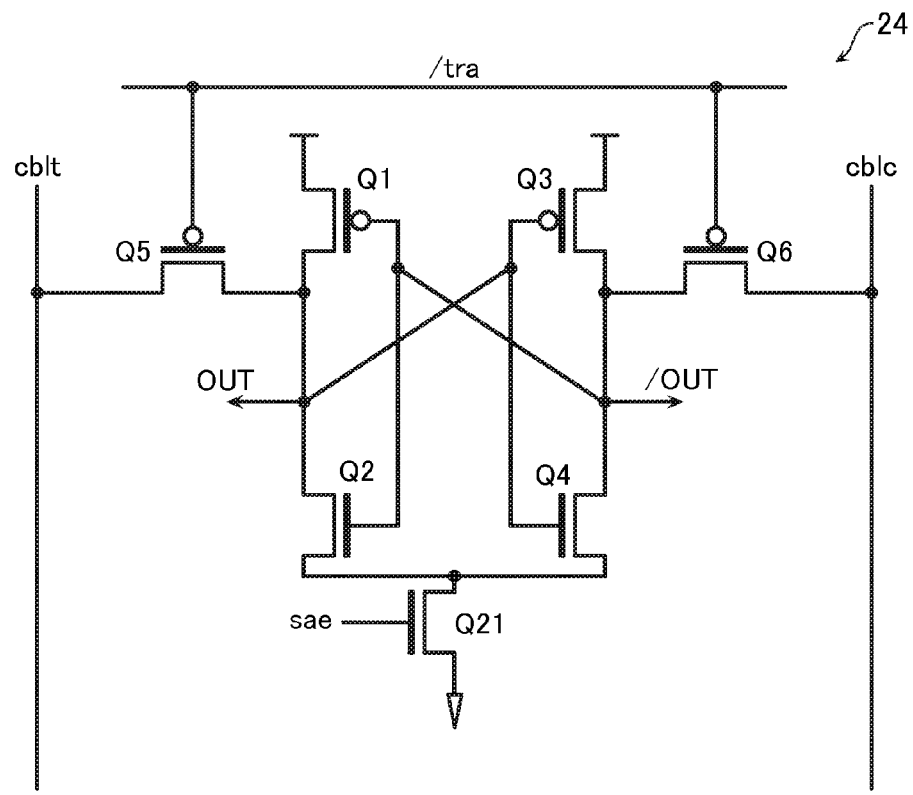
FIG. 5 is a circuit diagram of a sense amplifier in a comparison example.

FIG. 5 is a circuit diagram of a sense amplifier 24 according to the comparison example generally used in an SRAM and so forth. The sense amplifier 24 includes the drive NMOS transistors Q2, Q4 connected on the source side to the ground terminal via an NMOS transistor Q21 and does not include the precharge PMOS transistors Q7, Q8 in FIG. 2. Other configurations are similar to those in FIG. 2.

In the sense amplifier 24, when the transfer signal /tra falls after data from the memory cell MC is transferred to the bit lines cblt, cblc, the transistors Q5, Q6 turn on such that both the inputs of the sense amplifier 24 are connected to the bit lines cblt, cblc, respectively. Here, the voltage on the bit line cblt is denoted with V(cblt) and the voltage on the bit line cblc with V(cblc). When the sense amplifier enable signal sae rises to Vdd, the sense amplifier 24 differentially amplifies both the voltages and, if V(cblt)>V(cblc), it turns the output OUT to Vdd and the output /OUT to 0 V. If V(cblt)<V(cblc), it turns the output OUT to 0 V and the output /OUT to Vdd. For the purpose of lowering power consumption, it is preferable to reduce the time for charging and discharging the bit lines cblt, cblc as short as possible. Therefore, it is desired to start sensing by the sense amplifier 24 at the stage when the bit lines cblt, cblc cause a slight potential difference.

Figure 6:
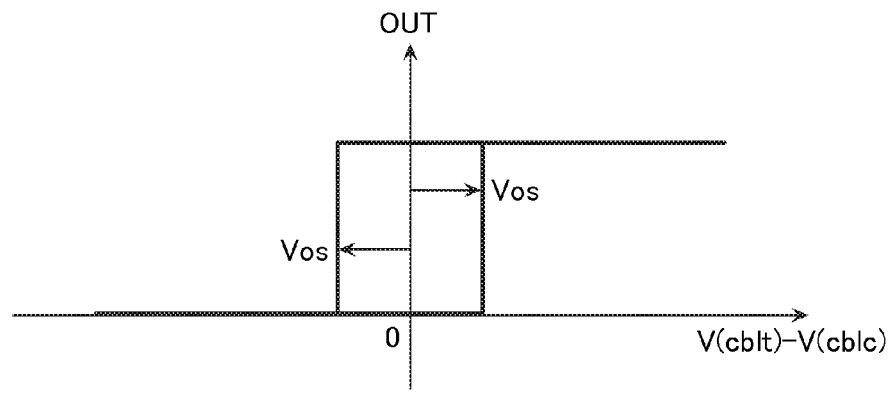
FIG. 6 is a graph illustrative of an offset voltage in the same sense amplifier.

In practice, however, there are variations in the thresholds Vth1, Vth2 of the drive NMOS transistors Q2, Q4. Therefore, if sensing is not started at the stage when the difference between the bit line voltages V(cblt)−V(cblc) exceeds Vos, where Vos=Vth1−Vth2, failed data read may occur. This is shown in FIG. 6. The voltage Vos is the "offset voltage", which varies +/−about the point at which the difference between the bit line voltages is 0 V. This offset voltage is one of the factors that cause the delay of sensing about the bit lines cblt, cblc.

Therefore, the sense amplifier 4 of the present embodiment precharges the output terminals OUT, /OUT of the first and second inverters INV1, INV2 via the PMOS transistors Q7, Q8 prior to sensing, thereby holding the threshold information Vth1, Vth2 of the NMOS transistors Q2, Q4 in the first and second capacitors Q11, Q12, and compensates for the source voltages on the NMOS transistors Q2, Q4 by the threshold information Vth1, Vth2 held in the first and second capacitors Q11, Q12 at the time of sensing, thereby enabling a quick start of sensing.

Figure 3:
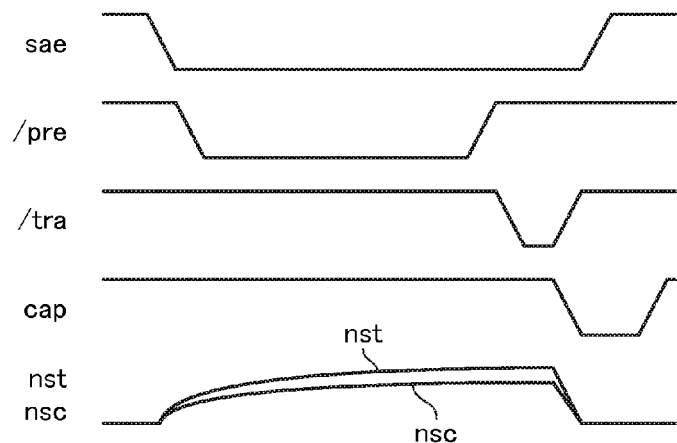
FIG. 3 is a diagram of operating waveforms in the same sense amplifier.

Based on FIG. 3, an operation of the sense amplifier 4 according to the present embodiment is described. FIG. 3 is a waveform diagram showing the operation of the sense amplifier 4. First, when the sense amplifier enable signal sea falls, the transistors Q9, Q10 in the sense amplifier 4 turn off. Subsequently, when the precharge signal /pre falls, the transistors Q7, Q8 turn on to apply Vdd to the gates of the transistors Q2, Q4 so that the transistors Q2, Q4 turn on. Thus, the source nodes nst and nsc of the transistors Q2, Q4 exhibit Vdd−Vth1 and Vdd−Vth2, respectively. On the other hand, the input terminal of the source control signal cap is applied with Vdd. Accordingly, the capacitors Q11, Q12 are charged by the amounts of charge corresponding to −Vth1, −Vth2, respectively. Next, the precharge signal /pre rises and the transfer signal /tra falls. In this case, the transistors Q5, Q6 turn on so that both the inputs of the sense amplifier 4 are connected to the bit lines cblt, cblc, respectively. Thus, the voltages V(cblt), V(cblc) on the bit lines cblt, cblc are transferred to the inputs of the sense amplifier 4. Next, the source control signal cap falls, and then the sense amplifier enable signal sea rises with a delay. In this case, as the capacitors Q11, Q12 are charged by the amounts of charge corresponding to −Vth1, −Vth2, switching can be executed at the same time regardless of the difference between the thresholds Vth1, Vth2 of the transistors Q2, Q4 so that the sense amplifier 4 starts sensing quickly. This makes it possible to exclude the influence of the offset voltage Vos. By the way, according to the simulation by the Inventors, the variation (o) in the offset voltage Vos of the sense amplifier 24 in the comparison example is 25.0 mV while the variation in the offset voltage Vos of the sense amplifier 4 according to the present embodiment can be reduced to 6.4 mV.

Thus, the sense amplifier 4 according to the present embodiment makes it possible to reduce the time for charging and discharging the bit line pair to achieve lowered power. In addition, the number of additional transistors can be reduced to 5, which can lower the area overhead.

[Second Embodiment]

Figure 4:
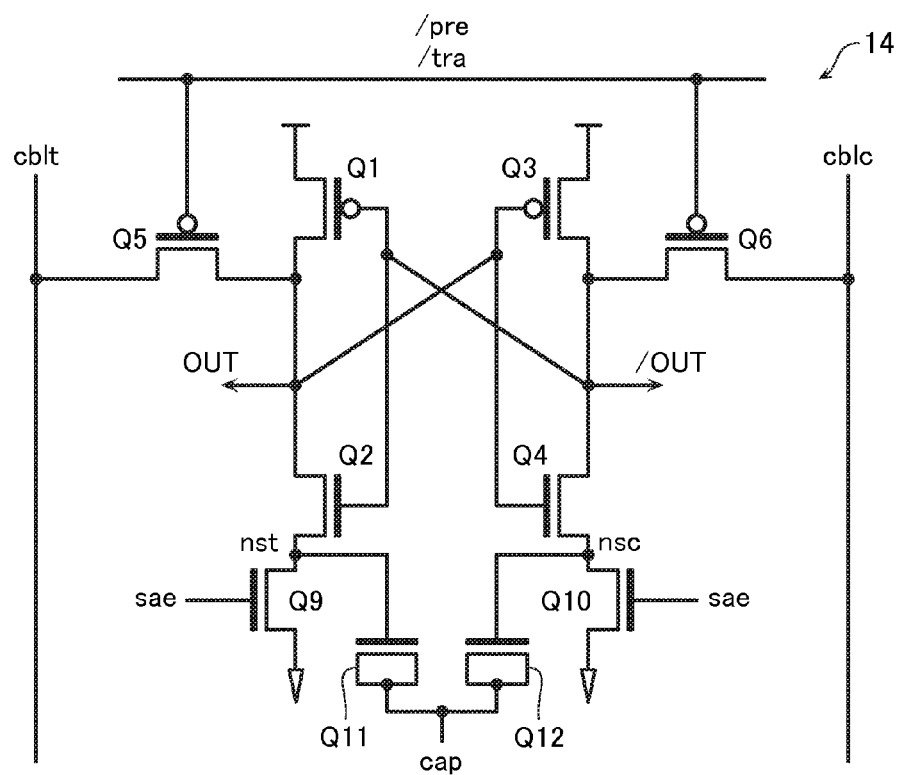
FIG. 4 is a circuit diagram of a sense amplifier in a semiconductor memory device according to a second embodiment.

FIG. 4 is a circuit diagram showing the configuration of a sense amplifier 14 according to a second embodiment. In this embodiment, the data transfer PMOS transistors Q5, Q6 are designed to also serve as the precharge PMOS transistors Q7, Q8 in the first embodiment to omit the precharge PMOS transistors Q7, Q8.

In the sense amplifier 14 according to the second embodiment, the bit lines cblt, cblc are precharged to Vdd prior to data transfer. Then, Vdd is applied to the gates of the NMOS transistors Q2, Q4 via the data transfer PMOS transistors Q5, Q6, thereby storing the threshold voltages Vth1, Vth2 in the capacitors Q11, Q12. Other operations are similar to those of the sense amplifier 4 according to the preceding embodiment and accordingly omitted from the description.

The present embodiment makes it possible to lower power consumption as in the preceding embodiment. In addition, the number of additional transistors can be reduced to 3, which can further lower the area overhead as an advantage.

[Other Embodiments]

In the first and second embodiments, the NMOS transistors Q2, Q4 are connected at the sources to the capacitors Q11, Q12 though the same effect can be exerted even if the NMOS transistors are replaced by PMOS transistors. Other than the above-described SRAM, it is also applicable to general semiconductor memory devices comprising a sense amplifier capable of differentially amplifying the voltages on a pair of bit lines, needless to say.

[Others]

While certain embodiments have been described, these embodiments have been presented by way of example only, and are not intended to limit the scope of the inventions. Indeed, the novel methods and systems described herein may be embodied in a variety of other forms: furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
   a memory cell;
   a first bit line and a second bit line connected to said memory cell; and
   a sense amplifier operative to amplify the voltage between said first and second bit lines, said sense amplifier including a first and a second drive transistor configuring a transistor pair for differential amplification, and a first and a second capacitor connected between the sources of said first and second drive transistors and a source control terminal, respectively, wherein said sense amplifier precharges said first and second drive transistors on the drain side prior to sensing, thereby holding the threshold information on said first and second drive transistors in said first and second capacitors, and compensates for the source voltages on said first and second drive transistors by the threshold information held in said first and second capacitors at the time of sensing.

2. The semiconductor memory device according to claim 1, wherein said sense amplifier further includes a first precharge transistor connected between the drain of said first drive transistor and a first reference voltage terminal, and a second precharge transistor connected between the drain of said second drive transistor and said first reference voltage terminal.

3. The semiconductor memory device according to claim 1, wherein said sense amplifier further includes a first transfer transistor connected between said first bit line and the drain of said first drive transistor, and a second transfer transistor connected between said second bit line and the drain of said second drive transistor.

4. The semiconductor memory device according to claim 3, wherein said first and second transfer transistors are driven, after completion of precharging said first and second drive transistors by a precharge signal, to transfer data from said first and second bit lines to the drains of said first and second drive transistors.

5. The semiconductor memory device according to claim 2, wherein said first precharge transistor also serves as a first transfer transistor for data communication with said first bit line, wherein said second precharge transistor also serves as a second transfer transistor for data communication with said second bit line.

6. The semiconductor memory device according to claim 5, wherein said first and second bit lines are precharged to a first reference voltage prior to sensing and operative to hold data at the time of sensing, wherein said first and second precharge transistors are driven again, after completion of precharging said first and second drive transistors by a precharge signal, to transfer data from said first and second bit lines to the drains of said first and second drive transistors.

7. The semiconductor memory device according to claim 1, wherein said sense amplifier includes a first and a second source control transistor connected between the sources of said first and second drive transistors and a second reference voltage terminal, respectively.

8. The semiconductor memory device according to claim 1, wherein said sense amplifier further includes a third drive transistor connected between a first reference voltage terminal and the drain of said first drive transistor to configure a first inverter together with said first drive transistor as connected in a complementary pair, and a fourth drive transistor connected between said first reference voltage terminal and the drain of said second drive transistor to configure a second inverter together with said second drive transistor as connected in a complementary pair, wherein the input terminal of said first inverter is connected to the output terminal of said second inverter, and the output terminal of said first inverter is connected to the input terminal of said second inverter.

9. A semiconductor memory device, comprising:

a memory cell;

a first bit line and a second bit line connected to said memory cell;

a sense amplifier operative to amplify the voltage between said first and second bit lines, said sense amplifier including a first and a second drive transistor configuring a transistor pair for differential amplification, and a first and a second capacitor connected between the sources of said first and second drive transistors and a source control terminal, respectively; and a controller operative to set said source control terminal to a first reference voltage and supply said sense amplifier with a precharge signal for precharing said first and second drive transistors on the drain side prior to sensing by said sense amplifier, and operative to set said source control terminal to a second reference voltage at the time of sensing by said sense amplifier, thereby controlling said sense amplifier so as to compensate for the source voltages on said first and second drive transistors by the threshold information held in said first and second capacitors.

10. The semiconductor memory device according to claim 9, wherein said sense amplifier further includes a first precharge transistor connected between the drain of said first drive transistor and a first reference voltage terminal, and a second precharge transistor connected between the drain of said second drive transistor and said first reference voltage terminal, wherein said controller provides said precharge signal to said first and second precharge transistors.

11. The semiconductor memory device according to claim 9, wherein said sense amplifier further includes a first transfer transistor connected between said first bit line and the drain of said first drive transistor, and a second transfer transistor connected between said second bit line and the drain of said second drive transistor, wherein said controller provides a transfer signal to said first and second transfer transistors after completion of precharging said first and second drive transistors by said precharge signal, wherein said first and second transfer transistors transfer data from said first and second bit lines to the drains of said first and second drive transistors.

12. The semiconductor memory device according to claim 9, wherein said first precharge transistor also serves as a first transfer transistor for data communication with said first bit line, wherein said second precharge transistor also serves as a second transfer transistor for data communication with said second bit line, wherein said first and second bit lines are precharged to a first reference voltage and said controller provides said precharge signal to said first and second precharge transistors prior to data transfer, wherein said first and second bit lines hold data to be transferred and said controller provides a transfer signal to said first and second transfer transistors at the time of data transfer.

13. The semiconductor memory device according to claim 9, wherein said sense amplifier includes a first and a second source control transistor connected between the sources of said first and second drive transistors and a second reference voltage terminal, respectively, wherein said controller brings said first and second source control transistors into conduction prior to said precharging.

14. The semiconductor memory device according to claim 9, wherein said sense amplifier further includes a third drive transistor connected between a first reference voltage terminal and the drain of said first drive transistor to configure a first inverter together with said first drive transistor as connected in a complementary pair, and a fourth drive transistor connected between said first reference voltage terminal and the drain of said second drive transistor to configure a second inverter together with said second drive transistor as connected in a complementary pair, wherein the input terminal of said first inverter is connected to the output terminal of said second inverter, and the output terminal of said first inverter is connected to the input terminal of said second inverter.

15. A sense amplifier capable of amplifying the voltage between a first and a second input line, comprising:

a first and a second drive transistor configuring a transistor pair for differential amplification; and a first and a second capacitor connected between the sources of said first and second drive transistors and a source control terminal, respectively, wherein said sense amplifier precharges said first and second drive transistors on the drain side prior to sensing, thereby holding the threshold information on said first and second drive transistors in said first and second capacitors, and compensates for the source voltages on said first and second drive transistors by the threshold information held in said first and second capacitors at the time of sensing.

16. The sense amplifier according to claim 15, further comprising:

a first precharge transistor connected between the drain of said first drive transistor and a first reference voltage terminal; and a second precharge transistor connected between the drain of said second drive transistor and said first reference voltage terminal.

17. The sense amplifier according to claim 15, further comprising:

a first transfer transistor connected between said first input line and the drain of said first drive transistor; and a second transfer transistor connected between said second input line and the drain of said second drive transistor.

18. The sense amplifier according to claim 15, wherein said first precharge transistor also serves as a first transfer transistor for data communication with said first input line, wherein said second precharge transistor also serves as a second transfer transistor for data communication with said second input line.

19. The sense amplifier according to claim 15, comprising a first and a second source control transistor connected between the sources of said first and second drive transistors and a second reference voltage terminal, respectively.

20. The sense amplifier according to claim 1, further comprising:

a third drive transistor connected between a first reference voltage terminal and the drain of said first drive transistor to configure a first inverter together with said first drive transistor as connected in a complementary pair; and a fourth drive transistor connected between said first reference voltage terminal and the drain of said second drive transistor to configure a second inverter together with said second drive transistor as connected in a complementary pair, wherein the input terminal of said first inverter is connected to the output terminal of said second inverter, and the output terminal of said first inverter is connected to the input terminal of said second inverter.

* * * * *